United States Patent
Richter et al.

(10) Patent No.: US 8,877,582 B2
(45) Date of Patent: Nov. 4, 2014

(54) METHODS OF INDUCING A DESIRED STRESS IN THE CHANNEL REGION OF A TRANSISTOR BY PERFORMING ION IMPLANTATION/ANNEAL PROCESSES ON THE GATE ELECTRODE

(71) Applicant: GLOBALFOUNDRIES Inc., Grand Cayman (KY)

(72) Inventors: Ralf Richter, Dresden (DE); Peter Javorka, Radeburg (DE); Stefan Flachowsky, Dresden (DE); Nicolas Sassiat, Dresdan (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 24 days.

(21) Appl. No.: 13/771,294

(22) Filed: Feb. 20, 2013

(65) Prior Publication Data

US 2014/0231907 A1    Aug. 21, 2014

(51) Int. Cl.
  *H01L 21/8238*    (2006.01)
  *H01L 29/66*    (2006.01)
  *H01L 29/78*    (2006.01)

(52) U.S. Cl.
  CPC ........ *H01L 29/7845* (2013.01); *H01L 29/6659* (2013.01); *H01L 21/823835* (2013.01)
  USPC ......................................................... 438/231

(58) Field of Classification Search
  USPC ......................................................... 438/231
  See application file for complete search history.

(56) References Cited

U.S. PATENT DOCUMENTS

| | | | |
|---|---|---|---|
| 4,737,837 A | | 4/1988 | Lee |
| 6,020,232 A | * | 2/2000 | Gardner et al. ............... 438/231 |
| 6,048,760 A | * | 4/2000 | Matsubara .................... 438/225 |
| 6,140,192 A | | 10/2000 | Huang et al. |

(Continued)

FOREIGN PATENT DOCUMENTS

WO    WO 2009046241 A1 *    4/2009

OTHER PUBLICATIONS

Park, H "Gate postdoping to decouple implant/anneal for gate, source/drain and extension: maximizing polysilicon gate activation for 0.1 /spl mu/m CMOS technologies" Symp. on VLSI Technology, 2002. Digest of Tech. Papers conference date Jun. 13, 2002 pp. 134-135.*

(Continued)

*Primary Examiner* — Yu-Hsi D Sun
*Assistant Examiner* — Grant Withers
(74) *Attorney, Agent, or Firm* — Amerson Law Firm, PLLC

(57) ABSTRACT

One method herein includes forming a gate structure above an active area of a semiconductor substrate, forming sidewall spacer structures adjacent the gate structure, forming a masking layer that allows implantation of ions into the gate electrode but not into areas of the active region where source/drain regions for the transistor will be formed, performing a gate ion implantation process to form a gate ion implant region in the gate electrode and performing an anneal process. An N-type transistor including sidewall spacer structures positioned adjacent a gate structure, a plurality of source/drain regions for the transistor and a gate implant region positioned in a gate electrode, wherein the gate implant region is comprised of ions of phosphorous, arsenic or an implant material with an atomic size that is equal to or greater than the atomic size of phosphorous at a concentration level that falls within the range of $5e^{18}$-$5e^{21}$ ions/$cm^3$.

25 Claims, 6 Drawing Sheets

(56) References Cited

U.S. PATENT DOCUMENTS

| | | |
|---|---|---|
| 6,200,870 B1 | 3/2001 | Yeh et al. |
| 6,306,738 B1 | 10/2001 | Selcuk |
| 6,642,119 B1 * | 11/2003 | Pelella et al. .................. 438/303 |
| 6,709,938 B2 * | 3/2004 | Miles et al. .................... 438/303 |
| 6,872,626 B1 | 3/2005 | Cheng |
| 7,195,968 B2 | 3/2007 | Kamiya et al. |
| 7,315,051 B2 | 1/2008 | Cheng |
| 7,344,964 B2 | 3/2008 | Park et al. |
| 7,358,144 B2 | 4/2008 | Im |
| 7,387,941 B2 | 6/2008 | Lee |
| 7,459,358 B2 | 12/2008 | Lee et al. |
| 7,795,670 B2 | 9/2010 | Lee et al. |
| 7,897,513 B2 | 3/2011 | Bu et al. |
| 8,110,871 B2 | 2/2012 | Lee et al. |
| 8,187,940 B2 | 5/2012 | Lee et al. |
| 8,357,572 B2 | 1/2013 | Lee et al. |
| 8,603,874 B2 * | 12/2013 | Shima ........................... 438/231 |
| 2005/0272190 A1 | 12/2005 | Lee et al. |
| 2007/0111413 A1 | 5/2007 | Im |
| 2007/0123010 A1 * | 5/2007 | Hoentschel et al. ........... 438/486 |
| 2008/0197389 A1 | 8/2008 | Park et al. |
| 2010/0155880 A1 | 6/2010 | Ban et al. |
| 2013/0052782 A1 * | 2/2013 | Flachowsky et al. ......... 438/303 |

OTHER PUBLICATIONS

Chittipeddi, S. "The Effect of Polysilicon Doping (Using Ion Implantation or PBr3 Diffusion or Insitu Doping) on TiSi2 Formation" MRS Advanced Metallization and Processing for Semiconductor Devices and Circuits Symposium C vol. 260 Spring/1992 pp. 207-212.*

Angelucci, R. "Characteristics of Arsenic Doped Polycrystalline Silicon-gate Capacitors After Rapid Thermal Processing" MRS Proc. vol. 106 Fall/1987 pp. 285-290.*

Lau, W. S. "Effective channel length increased due to switching from <<110>> to <<100>> orientation for PMOS transistors fabricated by 65 nm CMOS technology" IEEE conf. on Elec. Dev. and Sol. State Circuits 2008 Oct. 12, 2008 pp. 1-4.*

Wong, C.Y. "Doping of n+ and p+ polysilicon in a dual-gate CMOS process" Int. Elec. Dev. Meet. 1988 IEDM 88' Dec. 14, 1988 pp. 238-241.*

* cited by examiner

METHODS OF INDUCING A DESIRED STRESS IN THE CHANNEL REGION OF A TRANSISTOR BY PERFORMING ION IMPLANTATION/ANNEAL PROCESSES ON THE GATE ELECTRODE

BACKGROUND OF THE INVENTION

1. Field of the Invention

Generally, the present disclosure relates to the manufacture of sophisticated semiconductor devices, and, more specifically, to various methods of inducing desired stress levels and stress profiles in the channel region of a transistor device by performing an ion implantation process and an anneal process on the gate electrode of the transistor device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If the voltage applied to the gate electrode is less than the threshold voltage ($V_t$) of the device, then there is no current flow through the device (ignoring undesirable leakage currents, which are hopefully relatively small). However, when the voltage applied to the gate electrode equal or exceeds the threshold voltage ($V_t$) of the device, the channel region becomes conductive, and electrical current is permitted to flow between the source region and the drain region through the conductive channel region. During the fabrication of complex integrated circuit products using, for instance, CMOS technology, millions of transistors, e.g., N-channel transistors (NFET) and/or P-channel transistors (PFET), are formed on a substrate including a crystalline semiconductor layer.

To improve the operating speed of FETs, and to increase the density of FETs on an integrated circuit device, device designers have greatly reduced the physical size of FETs over the past decades. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

Device designers are under constant pressure to increase the operating speed and electrical performance of transistors and integrated circuit products that employ such transistors. Given that the gate length (the distance between the source and drain regions) on modern transistor devices may be approximately 20-50 nm, and that further scaling is anticipated in the future, device designers have employed a variety of techniques in an effort to improve device performance, e.g., the use of high-k dielectrics, the use of metal gate electrode structures, the incorporation of work function metals in the gate electrode structure, etc. One particular technique that has been employed to increase the performance of transistor devices involves so-called stress memorization techniques (SMT) wherein certain types of stresses are induced in the channel region of the device to increase the charge carrier mobility of such devices. More specifically, channel stress engineering techniques are employed to create a tensile stress in the channel region for NFET transistors (to improve electron mobility) and to create a compressive stress in the channel region for PFET transistors (to increase hole mobility). The techniques employed in forming such nitride layers with the desired tensile stress or the desired compressive stress is well known to those skilled in the art.

In the case of stress engineering techniques that are performed on N-type transistors, the SMT process typically involves 1) forming a patterned mask layer that exposes the N-type transistors but covers any P-type transistors; 2) performing an amorphization implant process on the source/drain regions of the exposed N-type transistors or form regions of amorphous material in the source/drain regions; 3) removing the patterned mask layer; 4) forming a thin layer of silicon dioxide on the N-type transistors and the P-type transistors; 5) forming a specifically made tensile stress-inducing silicon nitride layer, an SMT layer, on the silicon dioxide layer, wherein the tensile stress-inducing silicon nitride layer is intended to impart a desired tensile stress in the channel regions of the N-type transistors; 6) performing a brief re-crystallization anneal process (e.g., 650° C. for about 10 minutes in a nitrogen ambient); and 7) in some cases, performing one or more etching steps to remove the stress-inducing silicon nitride layer and the thin layer of silicon dioxide. During the etching process that is performed to remove the tensile stress-inducing SMT layer, the thin silicon dioxide layer protects the substrate and the sidewall spacers formed adjacent the gate structures of the devices. During the re-crystallization anneal process, the amorphous silicon material in the source drain region is re-crystallized.

The present disclosure is directed to various methods of inducing desired stress levels and stress profiles in the channel region of a transistor device by performing an ion implantation process and an anneal process on the gate electrode of the transistor device that may improve the performance of the transistor device.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of inducing desired stress levels and stress profiles in the channel region of a transistor device by performing an ion implantation process and an anneal process on the gate electrode. One illustrative method disclosed herein includes forming a gate structure above an active area of a semiconductor substrate, forming sidewall spacer structures adjacent the gate structure, after forming the sidewall spacer structures, forming a masking layer that allows implantation of ions into the gate electrode but not into areas of the active region where source/drain regions for the transistor will be formed, performing a gate ion implantation process to form a gate ion implant region in the gate electrode and, after performing the gate ion implantation process, performing an anneal process.

Another illustrative method disclosed herein for forming an integrated circuit product comprised of an N-type transistor and a P-type transistor includes the steps of forming a gate structure for the N-type transistor above a first active area of a semiconductor substrate, forming first sidewall spacer structures adjacent the gate structure of the N-type transistor, forming a gate structure for the P-type transistor above a second active area of the semiconductor substrate and forming second sidewall spacer structures adjacent the gate structure of the P-type transistor. In this example, the method also includes the steps of forming a masking layer that allows implantation of ions into the gate electrodes of the N- and P-type transistors but not into areas of the first and second active regions where source/drain regions for the N- and P-type transistors will be formed, performing a gate ion implantation process to implant ions into the gate electrodes of both of the N- and P-type transistors to thereby form gate ion implant regions comprised of the ions in the gate electrode and, after performing the gate ion implantation process, performing an anneal process.

One illustrative N-type transistor disclosed herein includes sidewall spacer structures positioned adjacent a gate structure, a plurality of source/drain regions for the transistor and a gate implant region positioned in a gate electrode, wherein the gate implant region is comprised of ions of phosphorous, arsenic or an implant material with an atomic size than is equal to or greater than the atomic size of phosphorous at a concentration level that falls within the range of $5e^{18}$-$5e^{21}$ ions/cm$^3$.

BRIEF DESCRIPTION OF THE DRAWINGS

The disclosure may be understood by reference to the following description taken in conjunction with the accompanying drawings, in which like reference numerals identify like elements, and in which.

Figure 1A:
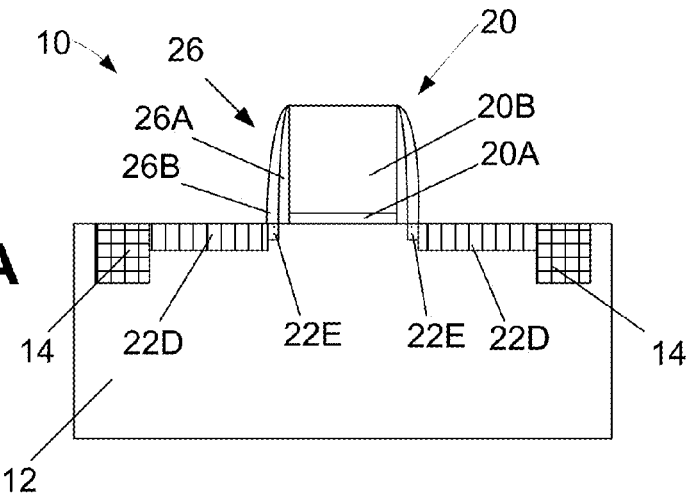
FIGS. 1A-1I depict various illustrative methods disclosed herein of inducing desired stress levels and stress profiles in the channel region of a transistor by performing an ion implantation process on the gate electrode of the transistor.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of inducing desired stress levels and stress profiles in the channel region of a transistor by performing an ion implantation process and an anneal process on the gate electrode. As will be readily apparent to those skilled in the art upon a complete reading of the present application, the present method is applicable to a variety of technologies, e.g., NFET, CMOS, etc., and is readily applicable to a variety of devices, including, but not limited to, ASIC's, logic devices, memory devices, etc. With reference to the attached drawings, various illustrative embodiments of the methods disclosed herein will now be described in more detail.

FIG. 1A is a simplified view of an illustrative N-type transistor device 10 at an early stage of manufacturing that is formed in and above an active region that is defined in a semiconductor substrate 12 by an illustrative isolation structure 14. The substrate 12 may have a variety of configurations, such as the depicted bulk silicon configuration. The substrate 12 may also have a silicon-on-insulator (SOI) configuration that includes a bulk silicon layer, a buried insulation layer and an active layer, wherein semiconductor devices are formed in and above the active layer. The substrate 12 may also be made of materials other than silicon. Thus, the terms "substrate" or "semiconductor substrate" or "semiconducting substrate" should be understood to cover all semiconductor structures and materials. Additionally, the depiction of the transistor structures in the attached drawings is intended to be representative in nature of any type of transistor device. Thus, the schematic depiction of the FET transistor devices in the drawings should not be considered to be limiting as it relates to the scope of the inventions disclosed herein. In general, the inventions disclosed herein may be employed with any of a variety of different types of transistors regardless of their shape or configuration or specific materials of construction. For example, although the inventions have been disclosed in the context of illustrative planar FET transistors, the methods disclosed herein could be equally applied to a product that contained a plurality of FinFET transistors or a combination of planar and FinFET transistor devices.

With continuing reference to FIG. 1A, the N-type transistor 10 includes a schematically depicted gate structure 20 comprised of an illustrative gate insulation layer 20A and an illustrative gate electrode 20B. The gate insulation layer 20A may be comprised of a variety of different materials, e.g., silicon dioxide, etc. The gate electrode 20B may be made of a variety of materials, such as, for example, polysilicon or amorphous silicon. Also depicted in FIG. 1A is an illustrative and representative sidewall spacer structure 26 comprised of inner and outer spacers 26A, 26B, respectively. The sidewall spacer structure 26 is intended to be representative of any type or arrangement of spacers/liner layers that are commonly employed in manufacturing transistor devices, e.g., the spacer structure 26 may be comprised of one or more spacers with or without various liner layers. The manner in which the spacer structure 26 and the gate structure 20 of the N-type transistor 10 are made are well known to those skilled in the art.

At the point of fabrication depicted in FIG. 1A, the gate structure 20 has been formed, the sidewall spacer structure 26 has been formed adjacent the gate structure 20 and one or more ion implantation processes have been performed to implant dopant materials into the substrate 12 to define what will eventually become the source/drain regions for the transistor 10. In modern transistor devices, the source/drain regions are typically formed by performing multiple ion implantation processes to introduce the desired dopant materials into the substrate 12. In the illustrative example depicted in FIG. 1A, two ion implantation processes were performed to form the source/drain implant regions. That is, in one illustrative example, after the gate structure 20 was formed, the inner spacer 26A was formed adjacent the gate structure. Thereafter, an initial ion implantation process was performed to form so-called extension implant regions 22E in the substrate 12. Then, the outer spacer 26B of the sidewall spacer structure 26 was formed proximate or adjacent the inner spacer 26A.

Thereafter, a second ion implantation process was performed to form so-called deep source/drain implant regions 22D in the substrate 12. The ion implantation process performed to form the deep source/drain implant regions 22D is typically performed using a higher dopant dose and at a higher implant energy than the ion implantation process that was performed to form the extension implant regions 22E. Depending upon the device under construction, the source/drain regions are typically implanted with different types of impurities, i.e., boron, phosphorus, etc. However, as will be recognized by those skilled in the art after a complete reading of the present application, the inventions disclosed herein are not dependent upon the manner in which the source/drain implantation processes are performed or the precise technique used in forming the gate structure 20 and the spacer structure 26. At the point of fabrication depicted in FIG. 1A, the so-called activation anneal process that is typically performed to activate the implanted dopant materials in the regions 22E, 22D, and to repair any damage to the substrate 12 due to the implantation processes, has not yet been performed.

Figure 1B:
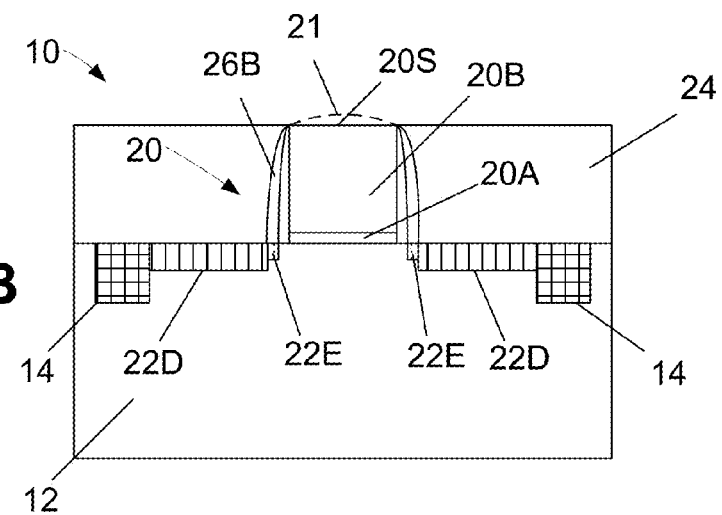

The next major process operation involves preparing the device 10 for the ion implantation process that will be selectively performed on the gate electrode 20B. To that end, FIG. 1B depicts the device after a masking layer 24, e.g., a photoresist mask, an OPL layer, etc., has been formed on the substrate 12. In some applications, the upper surface 20S of the gate electrode 20B may be exposed as part of this process operation. Various techniques may be employed in exposing the upper surface 20S of the gate electrode 20, e.g., by performing a chemical mechanical polishing (CMP) process, and/or an etch-back process, etc. In other embodiments, as indicated by the dashed line 21, there may be a relatively small amount of residual material positioned above the actual upper surface 20S of the gate electrode 20B. For example, the dashed line 21 may represent a thin oxide liner layer of residual portion of the materials used to form a part of the spacer structure 26. However, in such cases, the amount of residual material reflected by the dashed line 21 is sufficiently thin so that ions may be implanted into the gate electrode 20B, as described more fully below.

Figure 1C:
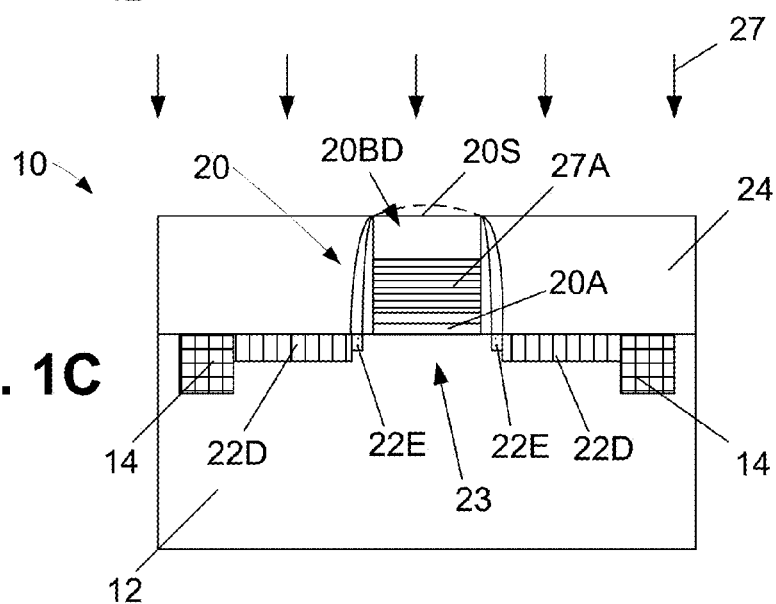

Next, as shown in FIG. 1C, a gate ion implantation process 27 is performed to form a gate implant region 27A in the gate electrode 20B to thereby define a doped gate electrode 20BD. The parameters of the gate ion implantation process 27 may vary depending upon the particular application, but the gate ion implantation process 27 will be performed using ions that, once implanted in the gate electrode 20BD, results in a spatial expansion of the gate material because of the changed atomic level allocation properties of the gate material. As one example, the gate implantation process 27 may be performed with a material such as, for example, phosphorous, etc. In one illustrative embodiment, the gate ion implantation process 27 may be performed using phosphorous, arsenic or an implant material with an atomic size (atomic radius) that is equal to or greater than the atomic size of phosphorous. In one illustrative example where the implanted material is phosphorous, the gate ion implantation process 27 may be performed using an implant dose greater than $5e^{12}$ ions/cm$^2$ and at an implant energy level of about 1-100 keV. In one illustrative embodiment, the resulting implant regions 27A may have an ion concentration of about $5e^{18}$-$5e^{21}$ ions/cm$^3$. In the case of other implant materials, the above-described parameters of the gate ion implantation process 27 may need to be varied. For example, if arsenic is the implanted material, the dopant dose may be equal to or greater than about $5e^{15}$ ions/cm$^2$.

The vertical location of the gate implant region 27A within the doped gate electrode 20BD may vary depending upon the particular application and the desired stress level to be induced in the channel region 23 of the N-type transistor 10. Moreover, in some applications, substantially all of the doped gate electrode 20BD may have implanted ions resulting from the gate ion implantation process 27. In general, the parameters of the gate ion implantation process 27 should be selected such that any significant portions of the ions implanted during the gate ion implantation process 27 do not penetrate into the gate insulation layer 20A or into the channel region 23, although there may be relatively minor amounts of the implanted ions that penetrate the gate insulation layer 20A or into the channel region 23 in some applications or process flows.

Figure 1D:
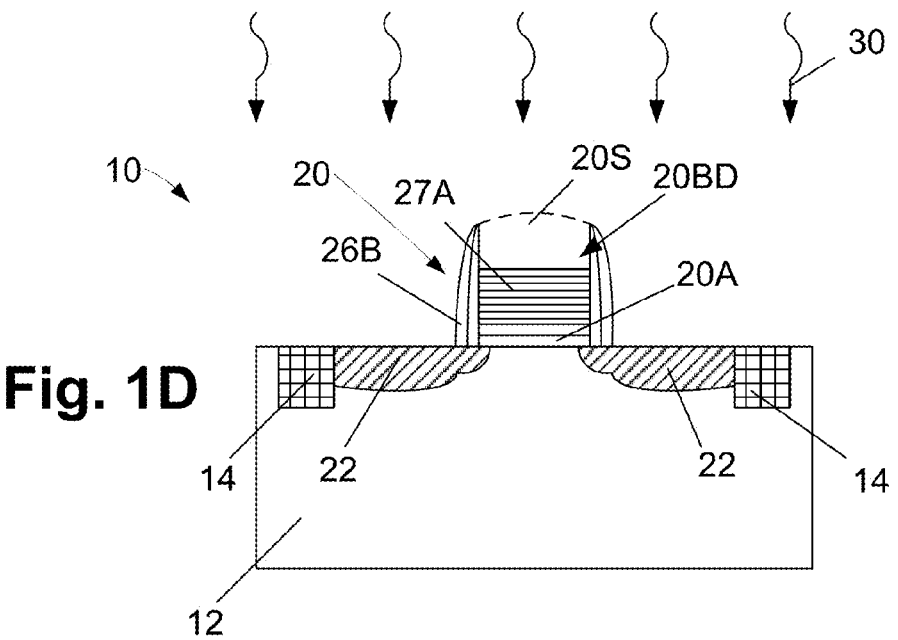

As shown in FIG. 1D, a re-crystallization anneal process 30 is performed on the N-type transistor 10. The temperature and duration of the anneal process 30 may vary depending upon the particular application. In one illustrative embodiment, the re-crystallization anneal process 30 may be performed at a temperature of about 1050° C. for a duration of a few seconds in a nitrogen ambient. The re-crystallization anneal process 30 is performed to activate the dopants implanted in the regions 22E, 22D (see FIG. 1C) and to repair any damage to the substrate 12 resulting from the ion implantation processes performed to form the implant regions 22E, 22D. Thus, the re-crystallization anneal process 30 results in the formation of the final source/drain regions 22 of the transistor 10, as shown in FIG. 1D.

Figure 1E:
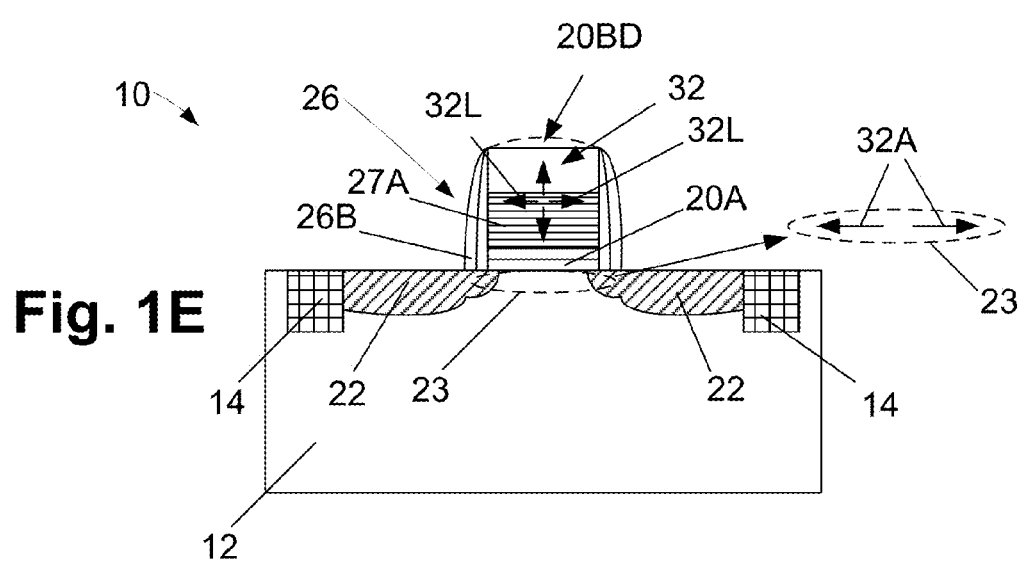

FIG. 1E is provided to explain how forming the gate implant region 27A in the doped gate electrode 20BD induces a desired tensile stress in an illustrative N-type transistor 10. By forming the gate implant region 27A selectively in the doped gate electrode 20BD, there is, in effect, extra material in the doped gate electrode 20BD as compared to the starting gate electrode 20B (FIGS. 1A-1B). As a result, the doped gate electrode 20BD wants to expand in all directions as indicated by the arrows 32. However, due to the presence of the sidewall spacer structure 26, lateral expansion of the doped gate electrode 20BD, i.e., expansion in a direction that is substantially parallel to the upper surface of the substrate 12, is effectively prohibited. Thus, at least a portion of the lateral-acting tensile stresses 32L that are present in the doped gate electrode 20BD are transferred to the channel region 23 of the N-type transistor 10, as reflected by the arrows 32A in FIG. 1E.

In one particular example, the substrate 12 may be a <100> silicon substrate, and the channel regions of the N-type transistor 10 is oriented along the <100> plane of the silicon substrate, the transistor is oriented such that current flow between the source/drain regions on the transistor is in a direction that is parallel to the <100> plane of the silicon substrate. By selecting this particular orientation, the performance of the NFET transistor 10 may be increased by performing the above-described process operations so as to thereby induce or increase the level of tensile stress in the channel region of the N-type transistor 10. Importantly, the above-described gate implantation process 27 and an anneal process 30 was performed on the gate electrode of a similarly oriented PFET transistor formed above the <100> silicon substrate. Accordingly, these process operations also induced a similar tensile stress in the channel region of the PFET transistor. However, the electrical performance of the PFET transistor was not degraded to any significant extent by the presence of the tensile stress in the <100> plane of the silicon substrate. This relationship occurs due to the physics involved in electron/hole interaction. For example, in this case, if the substrate orientation was changed from <100> to <110> (a rotation of the substrate by about 45°), that the channel regions of the NFET and PFET devices were oriented along the <110> plane, then the PFET device would be sensitive to tensile stress in the channel region of the PFET device and the techniques disclosed herein for increasing the tensile stress in the channel region of the NFET device would lead to a degradation of performance of the PFET device. While the NFET device would still see increased performance capabilities even if used on a <110> substrate, the performance capability of the overall integrated circuit would not likely see any appreciable increase due to the degradation in the performance of the PFET devices.

The process disclosed herein, whereby the doped gate electrode 20BD will be used to induce a desired tensile stress in the channel region 23 of the N-type transistor 10, is additive to any other SMT techniques that may be employed to establish the desired final tensile stress profile in the channel region 23 of the transistor 10. For example, the tensile stresses induced by the methods disclosed herein are additive to tensile stresses that may be induced in the channel region 23 of the transistor 10 by the formation of tensile-stressed layers of material, e.g., silicon nitride, above the source/drain regions of the transistor 10. The manner in which such tensile-stress layers are employed to induce the desired tensile stress in the channel region 23 of the N-type transistor 10 are well known to those skilled in the art.

Figure 1F:
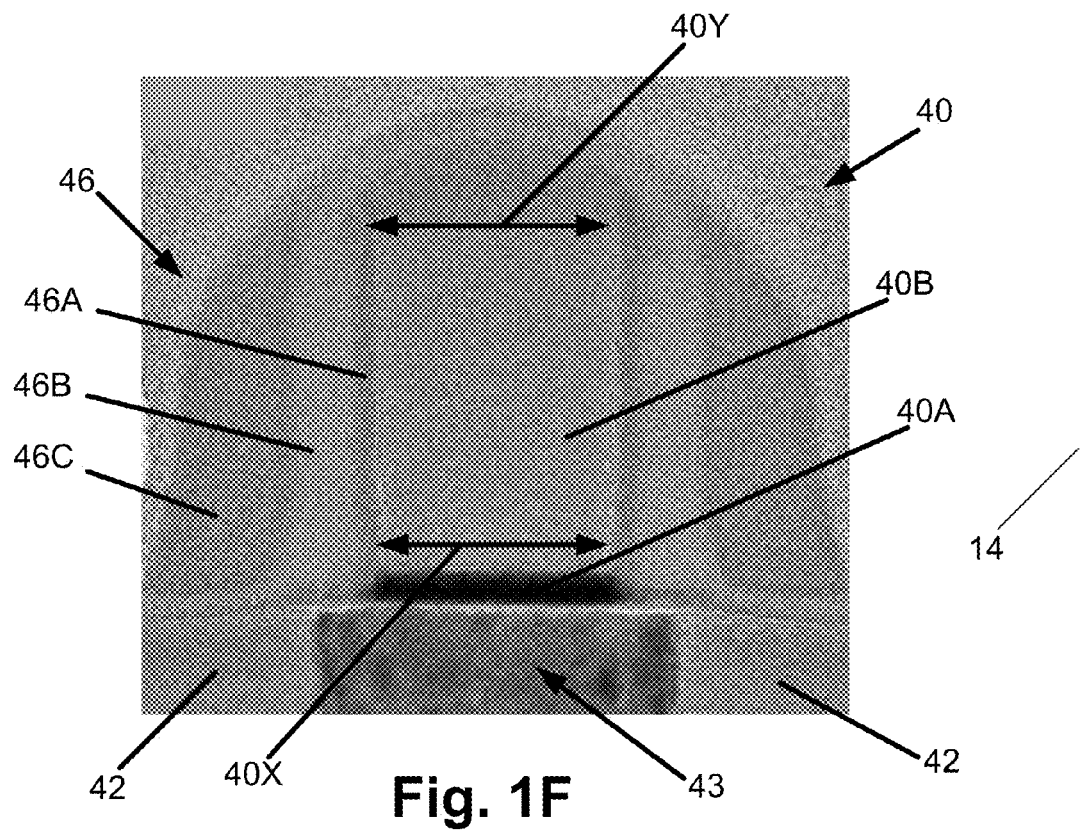

The inventors conducted an experiment to confirm that formation of the processes described above induced a tensile stress in the doped gate electrode 20BD of an NFET transistor. FIG. 1F is an SEM image of an illustrative NFET transistor 40 that was formed above a <100> silicon substrate, with the channel region 43 of the NFET transistor 40 oriented as described above for the N-type transistor 10. The NFET transistor 40 is comprised of a gate insulation layer 40A, a polysilicon gate electrode 40B, a channel region 43 and source/drain regions 42. The NFET transistor 40 also includes a spacer structure 46 comprised of a first silicon nitride spacer 46A (approximately 3 nm wide) positioned on the sidewalls of the gate electrode 40B, a second silicon dioxide spacer 46B (approximately 10 nm wide) and a third silicon nitride spacer 46C (approximately $15/19$ nm wide). The width 40X of the gate electrode 40B near the gate insulation layer 40A was about 23.3 nm, while the width 40Y of the gate electrode 40B at the top of the gate electrode 40B was about 26.4 nm. As part of the process of forming the NFET transistor 40, the gate ion implantation process 27 described above was performed to implant phosphorous into the gate electrode 40B. The anneal process 30 was also performed on the NFET transistor 40.

Figure 1G:
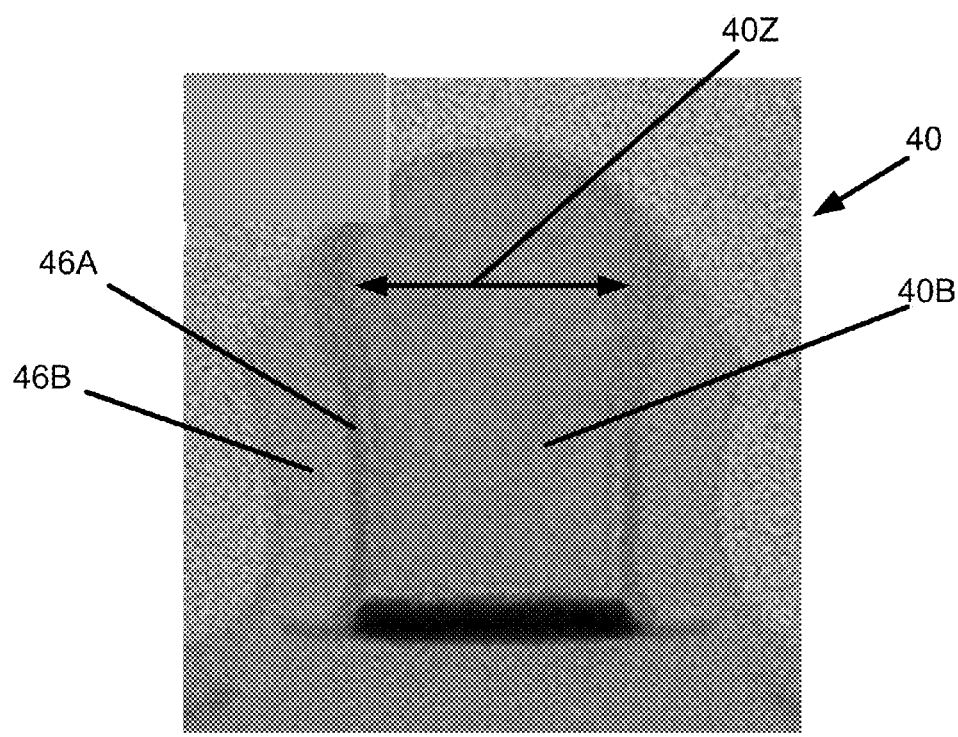

FIG. 1G is an SEM image of the NFET transistor 40 after the spacers 46C were removed. As can be seen, in this particular example, with the spacers 46C removed, the spacer structure 46 near the top of the gate electrode 40B was not stiff enough to prevent the expansion of the gate electrode 40B due to the formation of the gate implant region 27A in the gate electrode 40B. Note the "mushroom" shape of the gate electrode 40B as compared to the substantially rectangular shaped gate electrode 40B shown in FIG. 1F. The formation of the "mushroom" shaped gate electrode in FIG. 1G, when the spacer 46C was removed, proves that the gate ion implantation process 27, and the resulting gate implant region 27A, along with the other process operations described herein, does in fact create a tensile stress in the doped gate electrode structure 40B. By way of example, the width 40Z of the expanded, mushroom-shaped doped gate electrode 40B in FIG. 1G was about 28-29 nm. Accordingly, for the NFET transistor shown in FIG. 1F, i.e., with the entire spacer structure 46 in place, the presence of the non-relaxed, constrained, substantially rectangular shaped gate electrode 40B means that the tensile stress induced in the gate electrode 40B by performing the processes described herein remains in the doped gate electrode structure 40B. In turn, some or all of the pent-up tensile stress in the doped gate electrode 40B shown in FIG. 1F is transferred to the channel region 43 of the NFET transistor 40 in the manner described above with reference to FIG. 1E.

Figure 1H:
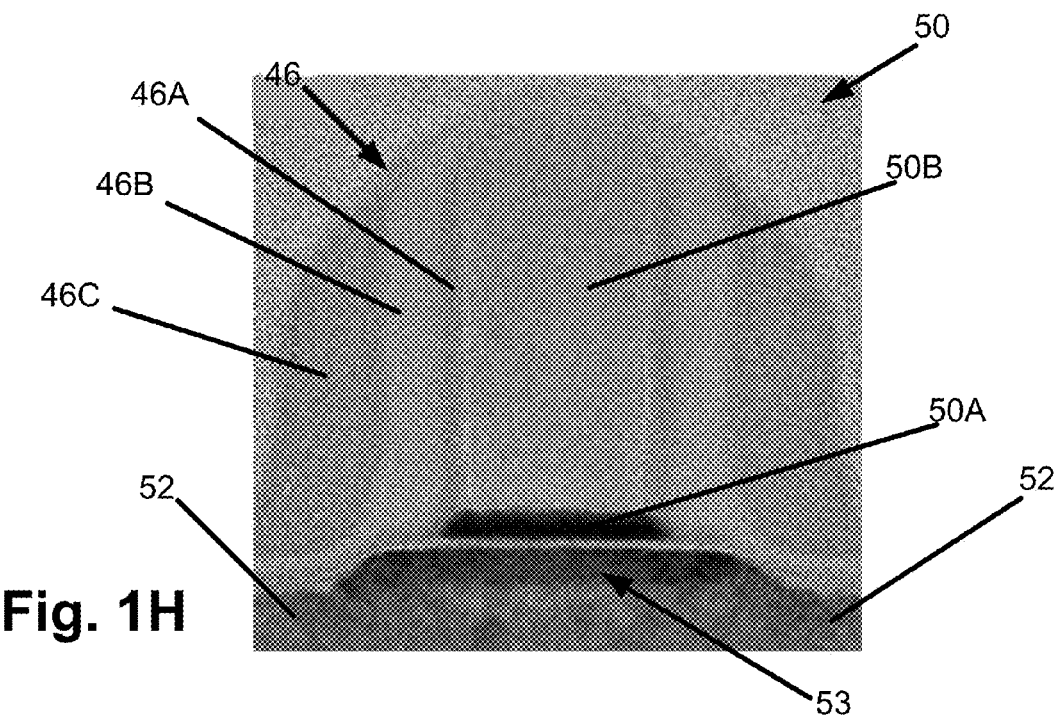

To confirm the pent-up stress in the NFET transistor 40 was the result of performing the gate implant process 27 and the anneal process 30, the inventors then removed the outer spacer 46C on another transistor, in this case an illustrative PFET transistor, that was not subjected to the above-described gate implant/anneal process. FIG. 1H is an SEM image of the PFET transistor 50 that was formed above a <100> silicon substrate and oriented as described above with respect to the NFET transistor 40 and the N-type transistor 10. The transistor 50 is comprised of a gate insulation layer 50A, a polysilicon gate electrode 50B, a channel region 53 and source/drain regions 52. The transistor 50 also includes the same basic spacer structure 46 as was formed on the NFET transistor 40, i.e., a first silicon nitride spacer 46A (approximately 3 nm wide) positioned on the sidewalls of the gate electrode 50B, a second silicon dioxide spacer 46B (approximately 9 nm wide) and a third silicon nitride spacer 46C (approximately 16.7 nm wide). An activation anneal process was also performed on the transistor 50.

Figure 1I:
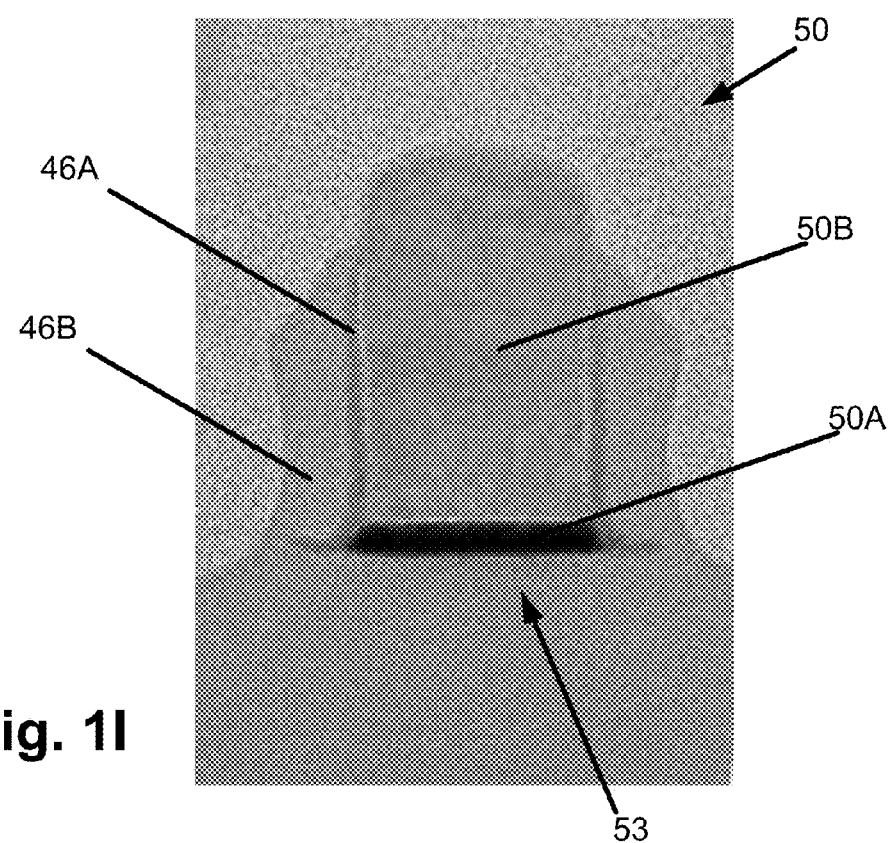

FIG. 1I is an SEM image of the transistor 50 after the spacers 46C were removed. As can be seen by comparing FIGS. 1H-1I, with or without the spacer 46C, the substantially rectangular configuration of the gate electrode 50B for the PFET transistor 50 remained substantially unchanged. This is in contrast to the impact that the implant region 27A/anneal process had on the NFET device 40. See FIGS. 1F-1G and the discussion above.

Figure 2A:
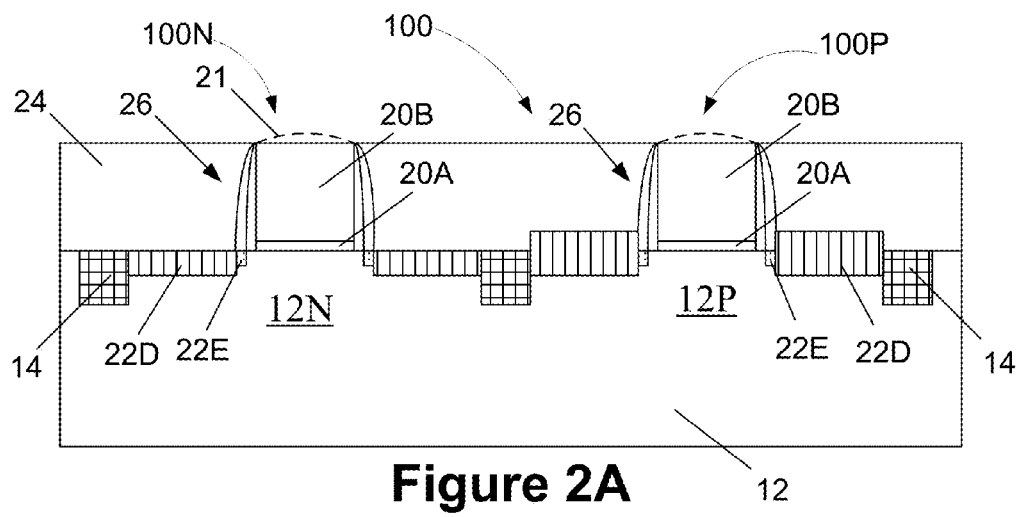
FIGS. 2A-2D depict various illustrative methods disclosed herein applied in the context of manufacturing an integrated circuit product that employs CMOS technology wherein the desired stress levels and stress profiles are induced in the channel region of the N-type transistors by performing an ion implantation process on the gate electrodes of both the N-type and P-type transistors, wherein electrical performance of the N-type transistors are improved without having a significant degradation in the electrical performance of the P-type transistors.

FIGS. 2A-2D depict various illustrative methods disclosed herein applied in the context of manufacturing an integrated circuit product 100 that employs CMOS technology (a combination of NMOS and PMOS devices) wherein the desired stress levels and stress profiles are induced in the channel region of the N-type transistors by performing the gate ion implantation process 27 on the gate structure of both device types without having an significant degradation in the electrical performance of the P-type transistors. The product 100 generally comprises an illustrative NFET transistor 100N and an illustrative PFET transistor 100P formed in and above an NFET region 12N and a PFET region 12P, respectively, of the substrate 12. The active regions 12N, 12P are defined by illustrative trench isolation structures 14 formed in the substrate 12. The point of fabrication depicted in FIG. 2A corresponds approximately to the point of fabrication depicted in FIG. 1B for the transistor 10 shown therein. That is, the gate structures 20, sidewall spacer structures 26, source/drain implant regions 22E, 22D have been formed for each of the NFET transistor 100N and the PFET transistor 100P (using different dopant materials for each device type). As will be appreciated by those skilled in the art, the illustrative PFET transistor 100P is depicted as having raised source/drain regions which is common for such devices. Also depicted in FIG. 2A is the masking layer 24 that is formed in preparation of performing the gate ion implantation process 27 on the gate electrodes 20B of both the NFET transistor 100N and the PFET transistor 100P.

Figure 2B:
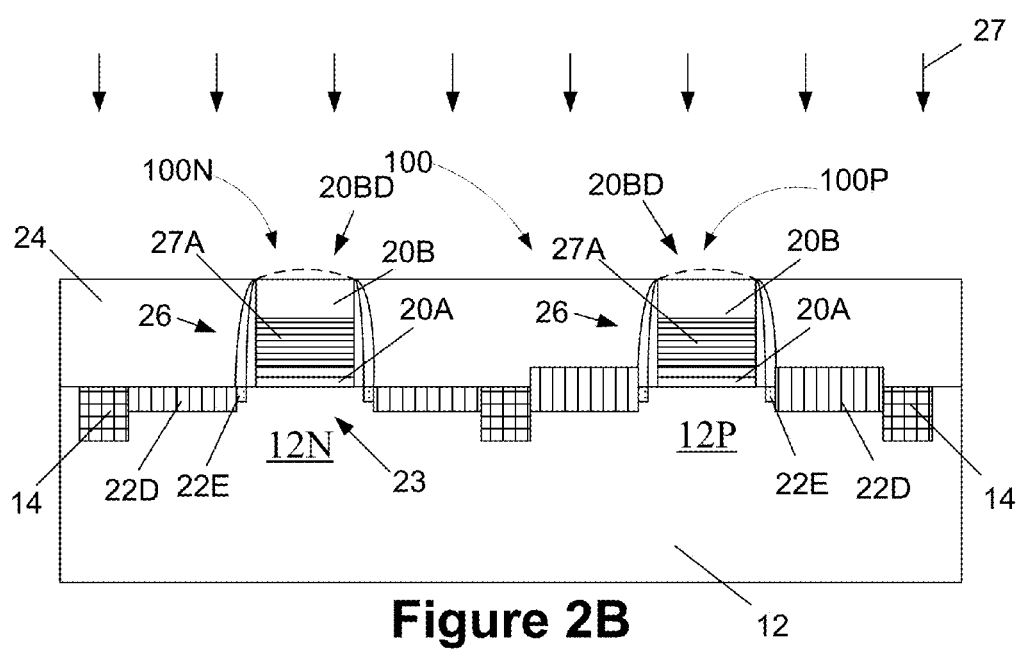

Next, as shown in FIG. 2B, the above-described gate ion implantation process 27 is performed to form a gate implant region 27A in the gate electrodes 20B of both the NFET transistor 100N and the PFET transistor 100P to thereby define doped gate electrodes 20BD. As before, the vertical location of the gate implant regions 27A within the doped gate electrodes 20BD may vary depending upon the particular application and the desired stress level to be induced in the channel region 23 of the NFET transistor 100N.

Figure 2C:
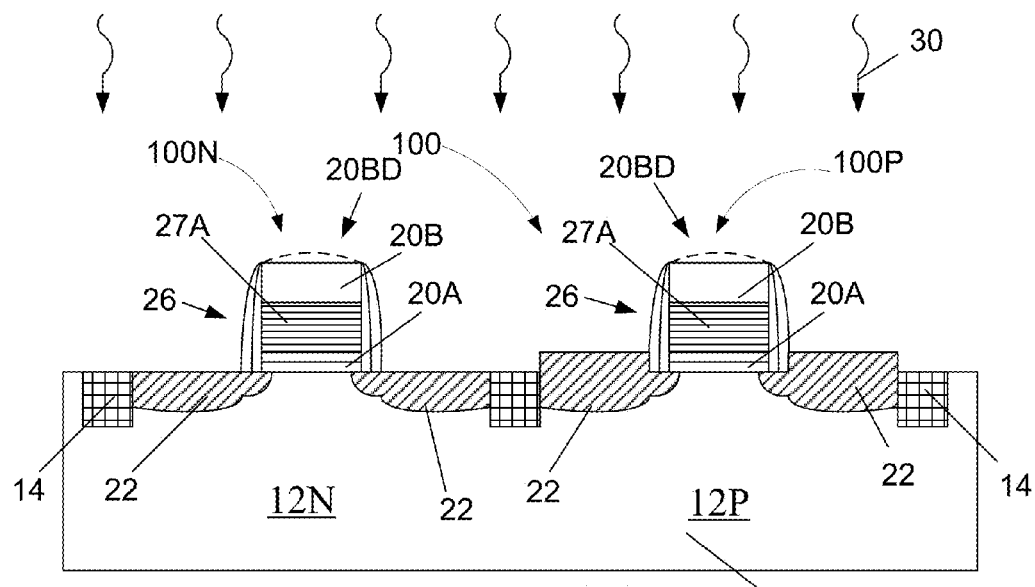

As shown in FIG. 2C, the above-described re-crystallization anneal process 30 was then performed on the product 100. As before, if the above-described SMT layers are employed, the re-crystallization anneal process 30 will be performed after the SMT's layers have been formed on NFET transistor 100N and the PFET transistor 100P. The re-crystallization anneal process 30 results in the formation of the final source/drain regions 22 of the transistors 100N, 100P.

Figure 2D:
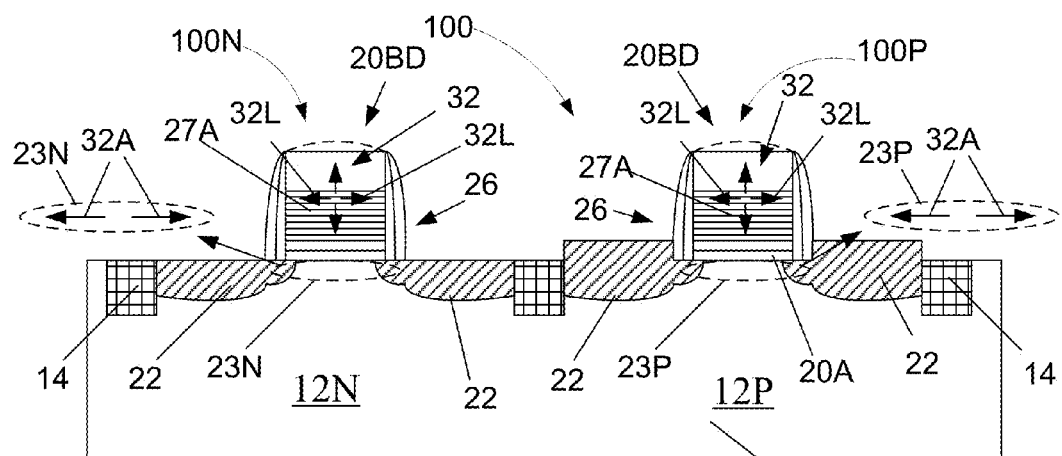

FIG. 2D depicts how performing the above-described processes induces a tensile stress 32A in the channel regions 23N, 23P of the NFET transistor 100N and the PFET transistor 100P, respectively. In the depicted example, the substrate 12 may be a <100> silicon substrate, and the channel regions 23N, 23P of the NFET transistor 100N and the PFET transistor 100P, respectively, are each oriented along the <100> plane of the silicon substrate 12. By selecting this particular orientation, the performance of the NFET transistor 100N may be increased due to the induced or increased level of tensile stress 32A in the channel region 23N of the NFET transistor 100N. However, even though the gate electrode 20B of the PFET transistor 100P received the same gate ion implantation process 27 and anneal treatment 30 as did the NFET transistor 100N, the induced tensile stress 32A in the channel region 23P of the PFET transistor 100P did not adversely affect the electrical performance characteristics of the PFET transistor 100P to any significant degree. Accordingly, using the methods disclosed herein, in one embodiment, the gate ion implantation process 27 may be used to selectively increase the performance of the NFET transistor 100N but not degrade the performance of the PFET transistor 100P. The fact that the gate ion implantation process 27 may be performed on the gate electrodes of both the NFET transistor 100N and the PFET transistor 100P simplifies processing and reduces costs by avoiding the cost associated with having to mask the PFET transistor 100P during the gate ion implantation process 27.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an integrated circuit product comprised of an N-type transistor and a P-type transistor, comprising:
    forming a gate structure for said N-type transistor above a first active area of a semiconductor substrate, said gate structure of said N-type transistor comprising a gate insulation layer and a gate electrode comprised of a silicon-containing material;
    forming first sidewall spacer structures adjacent said gate structure of said N-type transistor;
    forming a gate structure for said P-type transistor above a second active area of said semiconductor substrate, said gate structure of said P-type transistor comprising a gate insulation layer and a gate electrode comprised of a silicon-containing material;
    forming second sidewall spacer structures adjacent said gate structure of said P-type transistor;
    forming a masking layer that allows implantation of ions into said gate electrodes of said N- and P-type transistors but not into areas of said first and second active regions where source/drain regions for said N- and P-type transistors will be formed;
    performing a gate ion implantation process to implant ions into said gate electrodes of both of said N- and P-type transistors to thereby form a gate ion implant regions comprised of said ions in said gate electrode for said N-type transistor and in said gate electrode of said P-type transistor; and
    after performing said gate ion implantation process, performing an anneal process.

2. The method of claim 1, wherein said first and second sidewall spacer structures for each of said N- and P-type transistors, respectively, is comprised of a plurality of sidewall spacers.

3. The method of claim 1, wherein said first and second sidewall spacer structures for each of said N- and P-type transistors, respectively, is comprised of the same arrangement of sidewall spacers.

4. The method of claim 1, wherein said gate electrode for each of said N- and P-type transistors is comprised of one of polysilicon or amorphous silicon.

5. The method of claim 1, wherein performing said gate ion implantation process comprises performing said gate ion implantation process using an ion dose greater than $5e^{18}$-$5e^{21}$ ions/cm$^2$ and an implant energy level that falls within the range of 1-100 keV.

6. The method of claim 1, wherein said anneal process is performed at a temperature of at least 1050° C. for a duration of at least 2-10 seconds in a nitrogen ambient.

7. The method of claim 1, wherein said substrate is a <100> silicon substrate, and a channel region of each of said N- and P-type transistors is oriented approximately parallel relative to the <100> plane of said silicon substrate.

8. The method of claim 1, wherein said gate electrode of said N-type transistor with said gate ion implant region therein induces a tensile stress in a channel region of said N-type transistor.

9. The method of claim 8, wherein said gate electrode of said P-type transistor with said gate ion implant region therein induces a tensile stress in a channel region of said P-type transistor.

10. The method of claim 1, wherein said ions are comprised of phosphorous, arsenic or an implant material with an atomic size that is equal to or greater than the atomic size of phosphorous.

11. The method of claim 1, wherein said ions are comprised of ions that result in a spatial expansion of said gate electrode after performing said gate ion implantation process and said anneal process.

12. The method of claim 1, wherein said gate implant region in each of said N- and P-type transistors has a concentration of said ions that falls within the range of $5e^8$ -$5e^{21}$ ions/cm$^3$.

13. The method of claim 1, wherein performing said gate ion implantation process comprises performing said gate ion implantation process using an ion dose greater than $1e^{15}$ ions/cm$^2$ and an implant energy level that falls within the range of 1-100 keV.

14. A method of forming an integrated circuit product comprised of an N-type transistor and a P-type transistor, comprising:
   forming a gate structure for said N-type transistor above a first active area of a semiconductor substrate, said gate structure of said N-type transistor comprising a gate insulation layer and a gate electrode comprised of a silicon-containing material, wherein said substrate is a <100> silicon substrate, and a channel region of each of said N- and P-type transistors is oriented approximately parallel relative to the <100> plane of said silicon substrate;
   forming first sidewall spacer structures adjacent said gate structure of said N-type transistor;
   forming a gate structure for said P-type transistor above a second active area of said semiconductor substrate, said gate structure of said P-type transistor comprising a gate insulation layer and a gate electrode comprised of a silicon-containing material;
   forming second sidewall spacer structures adjacent said gate structure of said P-type transistor;
   forming a masking layer that allows implantation of ions into said gate electrodes of said N- and P-type transistors but not into areas of said first and second active regions where source/drain regions for said N- and P-type transistors will be formed;
   performing a gate ion implantation process to implant ions into said gate electrodes of both of said N- and P-type transistors to thereby form a gate ion implant regions comprised of said ions in said gate electrode for said N-type transistor and in said gate electrode of said P-type transistor, wherein performing said gate ion implantation process comprises performing said gate ion implantation process using an ion dose greater than $1e^{15}$ ions/cm$^2$ and an implant energy level that falls within the range of 1-100 keV; and
   after performing said gate ion implantation process, performing an anneal process.

15. The method of claim 14, wherein said first and second sidewall spacer structures for each of said N- and P-type transistors, respectively, is comprised of the same arrangement of sidewall spacers.

16. The method of claim 14, wherein said gate electrode for each of said N- and P-type transistors is comprised of one of polysilicon or amorphous silicon.

17. The method of claim 14, wherein said gate electrode of said N-type transistor with said gate ion implant region therein induces a tensile stress in a channel region of said N-type transistor.

18. The method of claim 17, wherein said gate electrode of said P-type transistor with said gate ion implant region therein induces a tensile stress in a channel region of said P-type transistor.

19. The method of claim 14, wherein said gate implant region in each of said N- and P-type transistors has a concentration of said ions that falls within the range of $5e^{18}$ -$5e^{21}$ ions/cm$^3$.

20. A method of forming an integrated circuit product comprised of an N-type transistor and a P-type transistor, comprising:
   forming a gate structure for said N-type transistor above a first active area of a semiconductor substrate, said gate structure of said N-type transistor comprising a gate insulation layer and a gate electrode comprised of a silicon-containing material, wherein said gate electrode for each of said N-type transistors is comprised of one of polysilicon or amorphous silicon;
   forming first sidewall spacer structures adjacent said gate structure of said N-type transistor;
   forming a gate structure for said P-type transistor above a second active area of said semiconductor substrate, said gate structure of said P-type transistor comprising a gate insulation layer and a gate electrode comprised of a silicon-containing material, wherein said gate electrode for each of said P-type transistors is comprised of one of polysilicon or amorphous silicon;
   forming second sidewall spacer structures adjacent said gate structure of said P-type transistor;
   forming a masking layer that allows implantation of ions into said gate electrodes of said N- and P-type transistors but not into areas of said first and second active regions where source/drain regions for said N- and P-type transistors will be formed;
   performing a gate ion implantation process to implant ions into said gate electrodes of both of said N- and P-type transistors to thereby form a gate ion implant regions comprised of said ions in said gate electrode for said N-type transistor and in said gate electrode of said P-type transistor, wherein said gate implant region in each of said N- and P-type transistors has a concentration of said ions that falls within the range of $5e^{18}$-$5e^{21}$ ions/cm$^3$; and after performing said gate ion implantation process, performing an anneal process.

21. The method of claim 20, wherein said first and second sidewall spacer structures for each of said N- and P-type transistors, respectively, is comprised of the same arrangement of sidewall spacers.

22. The method of claim 20, wherein performing said gate ion implantation process comprises performing said gate ion implantation process using an ion dose greater than $5e^{18}$-$5e^{21}$ ions/cm$^2$ and an implant energy level that falls within the range of 1-100 keV.

23. The method of claim 20, wherein said substrate is a <100> silicon substrate, and a channel region of each of said N- and P-type transistors is oriented approximately parallel relative to the <100> plane of said silicon substrate.

24. The method of claim 20, wherein said gate electrode of said N-type transistor with said gate ion implant region therein induces a tensile stress in a channel region of said N-type transistor.

25. The method of claim 24, wherein said gate electrode of said P-type transistor with said gate ion implant region therein induces a tensile stress in a channel region of said P-type transistor.

* * * * *